United States Patent [19]

Koenck

[11] 4,455,523

[45] Jun. 19, 1984

[54] PORTABLE BATTERY POWERED SYSTEM

[75] Inventor: Steven E. Koenck, Cedar Rapids, Iowa

[73] Assignee: Norand Corporation, Cedar Rapids, Iowa

[21] Appl. No.: 385,830

[22] Filed: Jun. 7, 1982

[51] Int. Cl.³ .............................................. H02J 7/00
[52] U.S. Cl. ...................................... 320/43; 320/35; 320/39; 320/48; 340/636
[58] Field of Search .................... 320/2, 35, 39, 43, 48; 340/636

[56] References Cited

U.S. PATENT DOCUMENTS 4,203,103  5/1980  Osada et al. ........................ 340/636
4,308,492  12/1981  Mori et al. ............................ 320/35

*Primary Examiner*—William M. Shoop
*Assistant Examiner*—Anita M. Ault

*Attorney, Agent, or Firm*—Hill, Van Santen, Steadman & Simpson

[57] ABSTRACT

In an exemplary embodiment, a battery monitoring system includes sensors for monitoring battery parameters and a memory for storing data based thereon; for example, data may be stored representative of available battery capacity as measured during a deep discharge cycle, and by monitoring battery current thereafter during operation, a relatively accurate measure of remaining battery capacity becomes available. The battery monitoring system may include programmed processor circuitry and may be secured to the battery so as to receive operating power therefrom during storage and handling; thus, the performance of a given battery in actual use can be accurately judged since the battery system can itself maintain a count of accumulated hours of use and other relevant parameters.

43 Claims, 12 Drawing Figures

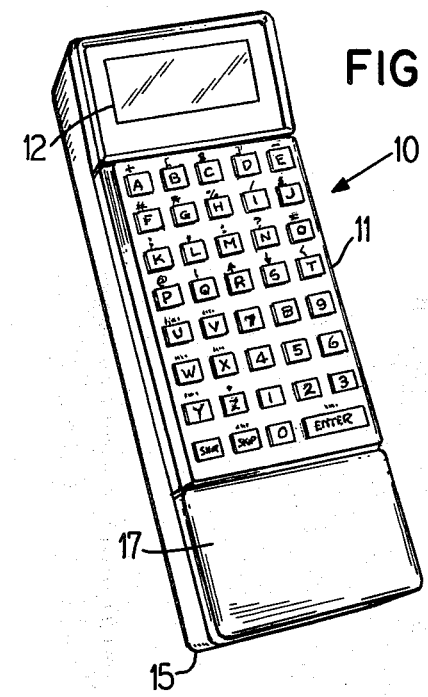
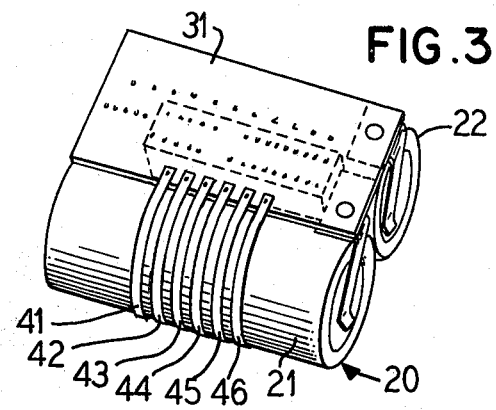
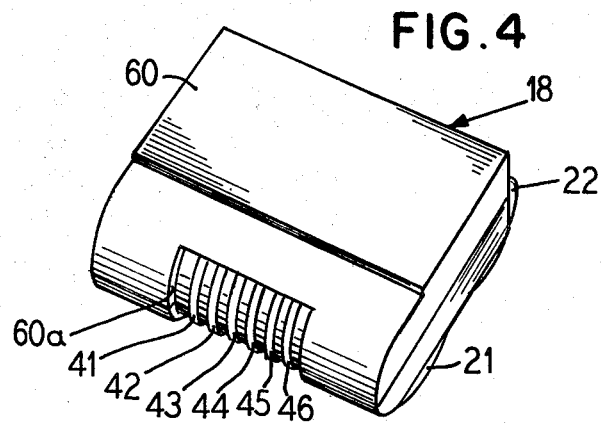
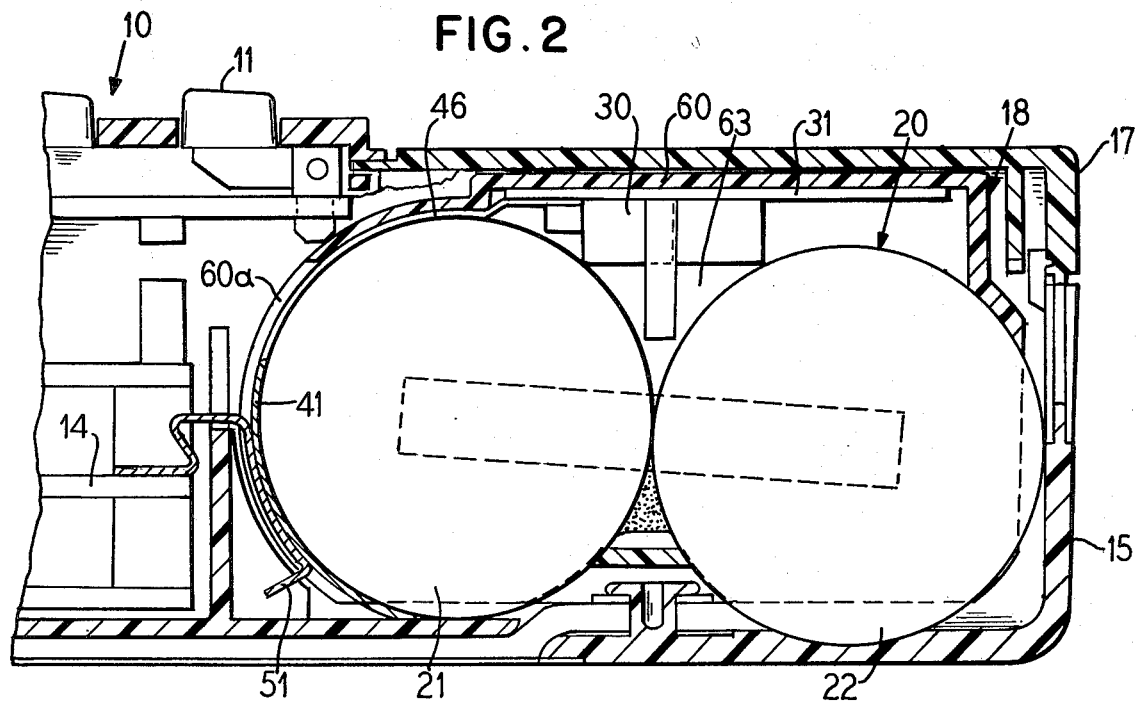

PORTABLE BATTERY POWERED SYSTEM

BACKGROUND OF THE INVENTION

The present invention relates to portable battery powered systems and particularly to a battery system for portable devices capable of optimizing the performance of a rechargeable electrochemical storage medium while at the same time maximizing its useful life.

Portable computerized systems are presently being extensively utilized in a wide range of applications. For example, such systems may be utilized in delivery vehicles which are to be away from a central warehouse or the like for a major part of each working day. Recharging operations may take place in locations subject to extremes of temperature. It is particularly crucial to avoid an equipment failure where a portable device is a vital link to the completion of scheduled tasks at remote locations and the like. In such circumstances a loss of adequate battery power can be just as detrimental as any other malfunction.

SUMMARY OF THE INVENTION

It is a basic objective of the present invention to provide a portable battery powered system of increased reliability and useful life.

An important feature of the invention resides in the provision of a portable system wherein the user can obtain a relatively accurate indication of the battery energy remaining available for use at any time during a portable operating cycle. Further, the user can be automatically alerted when battery capacity diminishes to a selected value, or when battery output voltage is at a selected marginal level.

For the sake of recharging of a battery system as rapidly as possible without detriment to an optimum useful life span, battery parameters including battery temperature can be monitored during a charging cycle and the battery charging current can be adjusted accordingly.

Since a battery may deteriorate when subjected to repeated shallow discharge and recharging cycles, according to the present invention, a count of such shallow charge cycles may be automatically maintained throughout the operating life of the battery system, such that deep discharge cycles may be effected as necessary to maintain desired performance standards.

Furthermore, according to another highly significant feature of the invention, automatically operating battery monitoring and/or conditioning circuitry may be secured with the battery pack for handling as a unit therewith. The monitoring circuitry may receive its operating power from the battery pack during storage or handling such that a total history of the battery pack may be retained for example in a volatile memory circuit where such type of memory otherwise provides optimum characteristics for a portable system. The conditioning circuitry may have means for effecting a deep discharge cycle, and concomitantly with the deep discharge cycle, a measure of actual battery capacity may be obtained. From such measured battery capacity and a continuous measurement of battery current during portable operation, a relatively accurate "fuel gauge" function becomes feasible such that the risk of battery failure during field operation can be essentially eliminated. The performance of a given type of battery in actual use can be accurately judged since the battery system can itself maintain a count of accumulated hours of use, and other relevant parameters.

The invention will now be described, by way of example and not by way of limitation, with reference to the accompanying sheets of drawings; and other objects, features and advantages of the invention will be apparent from this detailed disclosure and from the appended claims.

BRIEF DESCRIPTION OF THE DRAWINGS

FIG. 1 is a somewhat diagrammatic perspective view of a portable battery powered device which may incorporate a battery system in accordance with the teachings and principles of the present invention;

FIG. 2 is a somewhat diagrammatic enlarged longitudinal sectional view showing the battery compartment section and adjacent portions of the portable device of FIG. 1, with a battery pack assembly disposed in the battery compartment in operative coupling relationship with a central processing unit of the portable device for purposes of power supply to the central processing unit and for purposes of transmission of data and command signals;

FIG. 3 is a somewhat diagrammatic perspective view of a battery system in accordance with the teachings and principles of the present invention;

FIG. 4 is a perspective view similar to FIG. 3 but illustrating the battery system enclosed in a protective casing, to form a complete battery pack assembly for insertion into the battery compartment of the portable device, as a unit;

DETAILED DESCRIPTION

Figure 5:
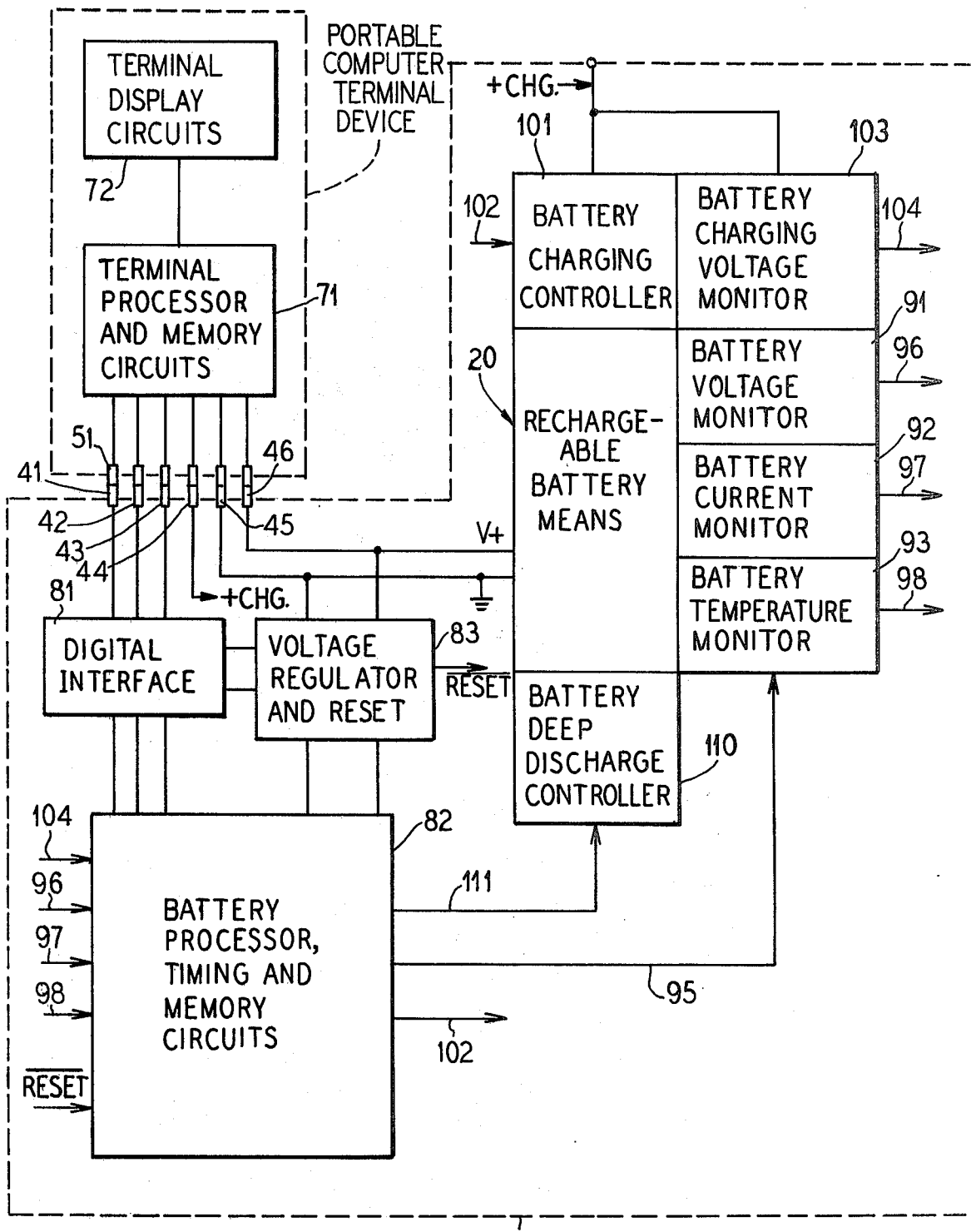
FIG. 5 shows a block diagram for explaining the cooperative relationship of the electronic parts of the particular portable computer terminal device and battery system shown in FIGS. 1 through 4, by way of example and not by way of limitation.

FIG. 1 is a perspective view of a portable battery powered device to which the present invention may be applied. The device is generally indicated by reference numeral 10 and is of a size to be conveniently held in one hand while a keyboard generally indicated at 11 is manually actuated by means of one or more fingers of the other hand. Characters entered by means of the keyboard 11 are displayed on a panel 12 under the control of a microprocessor located generally as indicated at 14 in FIG. 2. At an end 15 of the portable device a battery receiving means or compartment is provided. Access to the battery compartment is obtained via a removable cover element 17. By unlatching and opening the cover element 17, a battery pack assembly such as indicated at 18 in FIG. 4 may be inserted into or removed from the battery compartment.

By way of example, the battery pack assembly 18 may be comprised of rechargeable nickel-cadmium battery cells such as indicated at 21 and 22 in FIG. 2. By way of example, four nickel-cadmium cells may supply a nominal output voltage of five volts and have a rated capacity of about 2.2 ampere-hours. By way of example, the central processing unit 14 of the portable device 10 may require an operating voltage of five volts plus or minus ten percent, so that a voltage regulator would be associated with the central processing unit so as to ensure an actual supply voltage within the range from 4.5 volts to 5.5 volts. The size and weight of the portable device together with the battery pack assembly 18 is such that the complete portable battery powered system can be held in one hand while the keyboard 11 is being operated with the fingers of the other hand.

In a typical use of the portable devide 10, it is contemplated that the device may be used in an outdoor environment so as to be subject to a wide temperature range and relatively intensive daily use for example eight to ten hours per day. The battery pack assembly 18 is to be so designed as to have a maximum useful life even in such a stringent environment, thereby to ensure the maximum utility and reliability of the overall portable system as represented in FIG. 1.

For the sake of ensuring optimum reliability and usefulness of the overall system of FIG. 1, the battery pack assembly 18 includes digital processing circuitry 30 capable of data communication with the central processing unit 14 of the device 10. To this end, in the illustrated embodiment, as indicated in FIG. 3, the battery means 20 including the rechargeable battery cells carries therewith a printed circuit board 31 having flexible electrically conductive straps 41 through 46 which automatically make firm and reliable electrical contact with connector strips such as indicated at 51 of the terminal device 10. Two of the conductive straps of the set 41-46 may be connected with the opposite polarity terminals of the battery means 20 so as to supply battery voltage to the regulator means of the central processing unit 14. The remaining straps of the set 41-46 may serve to provide a communication channel between a battery processor unit of the processor circuitry 30 and the central processor unit 14 of the terminal device 10.

Referring to FIG. 4, the battery pack assembly 18 may include an insulating casing part 40 which has an aperture at 60a in FIG. 4 for exposing the conductor straps 41 through 46 for resilient pressure engagement with respective cooperating terminal connectors such as indicated at 51 in FIG. 2. As indicated in FIG. 2, the dimensions of the battery compartment of the device 10 are closely matched to the dimensions of the battery pack assembly 18 so that the battery pack assembly 18 can only be fitted within the battery compartment in such a way that the straps 41 through 46 are in firm engagement with the respective terminal connectors such as 51.

From FIGS. 2, 3 and 4, it will be understood that the processor circuitry 30 including the conductive straps 41-46 is secured with the battery means 20 for removability from the battery compartment as a unit. Thus the battery pack assembly 18 has self-contained processor circuitry as indicated at 30. As will be explained hereinafter, this processor circuitry 30 is electrically coupled with the battery means 20 so as to receive operating power therefrom both while the battery means forms part of the portable system 10 and while the battery means is separate from the portable unit. Thus, even where the processor circuitry 30 is provided with a memory requiring a constant supply of power, data is not lost from the memory upon removal of the battery means from the portable device 10. Still further as will be hereinafter explained the processor circuitry 30 including its memory may be operable with a battery voltage substantially less than that required by the central processor unit 14, so that data is not lost from the memory of the processing circuitry of the battery pack assembly even where the battery means has been discharged so as to have a relatively low output voltage below the minimum required operating voltage for the central processing unit 14. In this way, the battery memory means is enabled to retain an operating history of a particular rechargeable battery pack over the entire life of such battery pack, while on the other hand the processor circuitry 30 is designed so as to require a minimum space beyond the outline configuration of the rechargeable battery cells themselves. In FIG. 2, it will be observed that the casing 60 is relatively closely spaced to the periphery of the battery cells such as 21 and 22 in comparison to the cross sectional dimensions of such battery cells, and that the processor circuitry 30 is of a width dimension as viewed in FIG. 2 so as to at least partially fit within a nitch such as indicated at 63 between the two sets of battery cells. Still further, such processor circuitry 30 is selected so as to provide an essentially minimal power drain on the battery means 20, such that the battery means may be stored for long periods of time without loss of the data stored in the battery memory means. For example, the processor circuitry 30 including its associated memory means may require only a few percent of the current required by the processing system of the portable unit 10. For example, a shelf life of from one to two months for the battery memory means is feasible.

DESCRIPTION OF FIG. 5

FIG. 5 illustrates an overall exemplary circuit diagram for the embodiment of FIGS. 1 through 4. in FIG. 5, reference numeral 71 indicates a terminal processor component including central processing unit 14 and associated memory circuits. Component 72 in FIG. 5 represents terminal display circuits which may be associated with the display screen 12 of FIG. 1. Terminal connectors such as 51 are also diagrammatically indicated and are shown as being electrically connected with the flexible straps 41 through 46, respectively, of the battery pack assembly.

In FIG. 5, the battery pack or rechargeable battery means is again generally designated by reference numeral 20, and the positive and negative output terminals of the battery means 20 are indicated as being connected with the terminal processor and memory circuits component 71 via electrically conductive straps 45 and 46.

Reference numeral 81 in FIG. 5 designates a digital interface component which serves for the coupling of the terminal processor of component 71 with a battery processor of component 82 of the battery pack assembly 18. Simply for the sake of example, communication between the battery processor of component 82 and the terminal processor of component 71 is indicated as taking place via three conductors which include respective conductive straps 41 through 43 of the battery pack assembly 18, FIG. 4. Further details of an exemplary digital interface circuit for implementing component 81 will be given in relation to a more detailed electric circuit diagram to be described hereinafter. For the sake of correlation with the detailed circuit to be later described, reference numeral 83 designates a voltage regulator and reset circuit. Component 83 serves to supply a regulated operating voltage to the component 82 as well as to circuits of the digital interface component 81 in a specific preferred implementation of the present invention to be derscribed hereinafter. Component 82 in such specific example includes a memory which requires a continuous operating voltage in order to maintain a continuous history of the battery means 20. The reset circuitry of component 83 is adapted to supply a RESET signal which serves to indicate that the memory means has had its operating voltage interrupted.

Components 91, 92 and 93 in FIG. 5 represent battery monitoring means operatively coupled with the battery means 20 for the purpose of obtaining quantitative measures of respective battery parameters. Where the respective parameter sensing means of components 91, 92 and 93 supply analog signals, digital to analog converter means may be associated with the monitor circuitry for the purpose of obtaining the quantitative parameter measurements in digital form. In a particular preferred arrangement to be hereafter described in detail, the battery processor of component 82 may supply digital reference signals via the line 95, and the digital reference value may be converted into a common analog reference signal for matching with the respective analog measurement values of components 91, 92 and 93. In this particular embodiment, comparator circuits may be included in components 91, 92 and 93 for comparing the respective analog measurement signals with the common analog reference value in a predetermined order, the logical output signals from the comparator means being supplied via lines 96, 96 and 98 to the processor means for signaling when the digitally generated analog reference signal has reached a level exceeding the analog measurement value being compared therewith. The digital measurement values so determined may be utilized as a basis for updating battery condition information in the memory of component 82.

A battery charging voltage input is indicated by the symbol "+CHG". Battery charging current is supplied to the rechargeable battery means 20 via a battery charging current path which is controlled by a battery charging controller circuit 101 which may receive a digital battery charge control signal via line 102 in FIG. 5. According to a preferred embodiment to be described in detail hereafter, the battery charging current path further includes a battery current sensing means which forms part of component 92. The arrangement is preferably such that the battery current measured by component 92 during a charging operation does not include any charging current which may be supplied to the terminal device including components 71 and 72 in FIG. 5. Thus the battery processor of component 82 during a charging operation receives from component 92 a quantitative measure of actual charging current supplied to the battery means itself. A battery charging voltage monitor 103 is operatively coupled with the battery charging voltage input "+CHG" and is operative to supply a quantitative measure of battery charging voltage to the processor circuitry of component 82. For example, in a preferred arrangement, the digital reference value supplied by line 95 in FIG. 5 is utilized periodically to generate an analog reference value for comparison with the analog reading of battery charging voltage of component 103. In this case, a comparator circuit of component 103 signals via output line 104 when the analog reference value exceeds the currently occurring analog value of the battery charging voltage. Thus, during a battery charging cycle, the battery processor of component 82 is supplied with battery operating information from which an optimum battery charging current can be selected. In particular, by sensing battery temperature during the battery charging operation, it is possible to provide a battery system which is adaptable to operation under a wide range of environmental conditions while yet assuring optimum efficiency in carrying out a battery recharging operation.

For further assuring the optimum conditioning and maximum operating life of the battery system, FIG. 5 illustrates a battery deep discharge controller component 110 as being electrically connected with the battery means and being controlled by an input line 111 for effecting a deep discharge conditioning of the battery means 20 at suitable times during the operating life of the battery means. In accordance with the teachings of the present invention, during the deep discharge cycle of the battery means, battery current is continuously measured by the battery current monitoring component 92 so as to enable the battery processor and memory circuits of component 82 to derive a quantitative measure of the available capacity of the battery means. In a relatively simple determination of battery capacity, the battery means 20 may be first fully charged, and then subject to a deep discharge cycle wherein the battery means is discharged at a predetermined rate until such time as the battery means 20 exhibits a battery output voltage of a predetermined value, for example, four volts where components 71 and 72 of the terminal device require a minimum operating voltage of say 4.5 volts. By way of example if the battery means has a nominal rated capacity of 2.2 amp hours, the battery may be discharged at a rate of 220 milliamperes (battery capacity C divided by ten). In this case a deep discharge cycle would be completed within not more than about ten to twelve hours. (See FIG. 8 which represents the discharge characteristic of one nickel-cadmium cell.) Charge current is coupled to the battery pack via conductive strap 44 of FIG. 5.

DESCRIPTION OF FIGS. 6 AND 7

Figure 6:
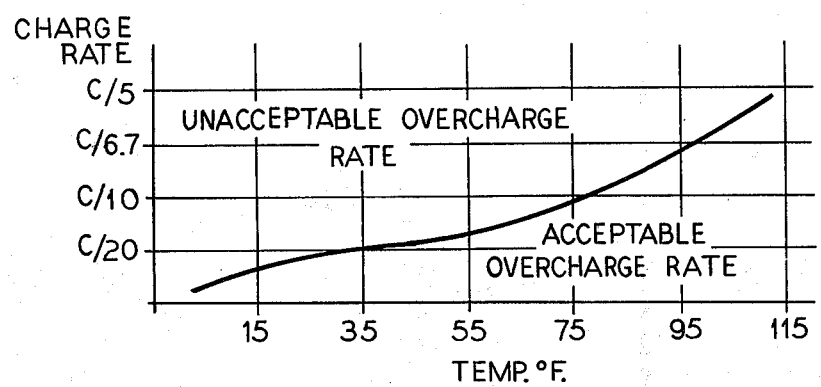
FIG. 6 shows a typical plot of permissible continuous overcharge rate as a function of temperature, for a particular type of rechargeable electrochemical energy storage cell, by way of example and not by way of limitation.

By way of background, FIG. 6 is a plot illustrating maximum charge rate as a function of temperature. It will be observed that at relatively low temperatures, the permissible charging rate is relatively low. Thus a battery systesm adaptable to a wide range of environmental conditions, and yet utilizing a maximum charging rate is achieved when the charging rate can be adjusted according to quantitative measurement of battery temperature during the charging cycle.

Specifically for the case of a nickel-cadmium battery pack overcharging is the point at which the majority of charge current generates oxygen at the positive electrode rather than increasing the state of charge of the cell. This point occurs at approximately the 75% state of charge level. As oxygen is generated, the internal pressure of the cell increases, which ultimately determines the amount of overcharge the cell can withstand.

The maximum allowable rate is a strong function of cell temperature. This is due to the fact that the generated oxygen must re-combine with cadmium at the negative electrode to prevent oxygen build-up and hence internal pressure increase. The rate of re-combination is dictated by cell temperature due to the viscosity of the electrolyte and the rate of the chemical reaction at the negative electrode. If the allowable overcharge rate for a given cell temperature is exceeded, the cell pressure may exceed the pressure relief valve safety level, causing venting and potentially expelling electrolyte, which drastically reduces cell life.

Figure 7:
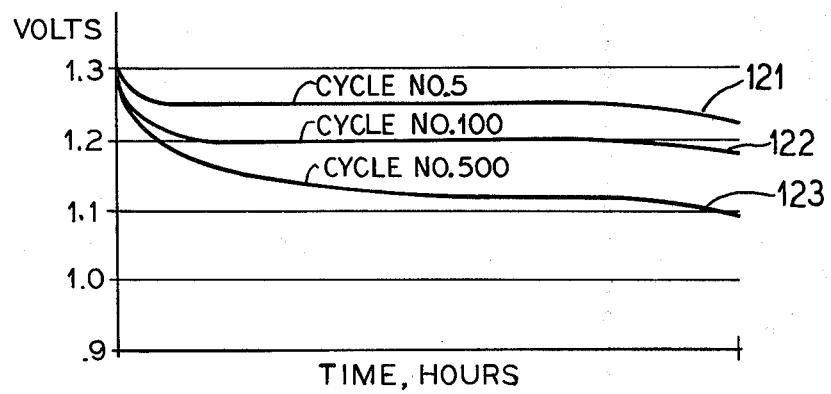
FIG. 7 is a plot of the effect of repetitive shallow cycling for the particular energy storage medium also represented by the plot of FIG. 6.

FIG. 7 illustrates the effect of repetitive shallow cycling on the output voltage of a given cell of a nickel-cadmium battery pack. Curves 121, 122 and 123 show the variation in output voltage over an operating cycle for respective increasing numbers of shallow operating cycles. Specifically curve 121 shows the variation in output voltage over time in hours for shallow discharge cycle number 5, while curve 122 represents the corresponding variation at shallow cycle number 100 and curve 123 shows the result at cycle number 500. Not only does repetitive shallow discharge produce a voltage depression effect as illustrated in FIG. 7, but this type of operation of the battery pack also causes a gradual and consistent degradation of cell capacity.

DESCRIPTION OF FIG. 8

Figure 8:
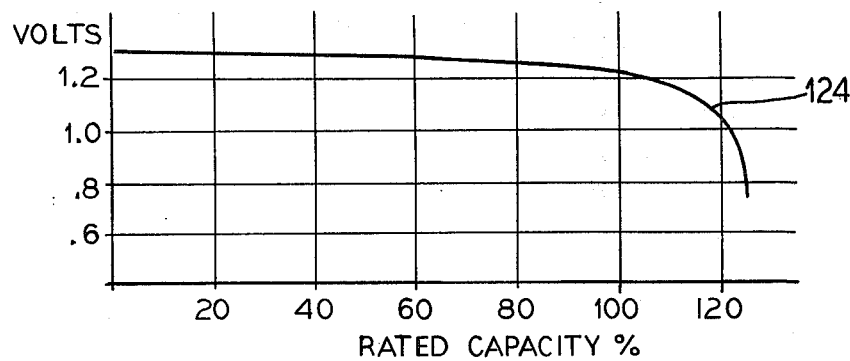
FIG. 8 is a plot of discharge characteristics for the particular energy storage medium also represented by the plots of FIGS. 6 and 7.

FIG. 8 illustrates the discharge characteristic for a nickel-cadmium cell. A deep discharge of the cell is considered to have taken place at region 124 where the output voltage begins to decrease relatively rapidly. A deep discharge cycle may be considered to have been effected when the cell voltage falls to a value of one volt, for example. A deep discharge, at a normal rate of battery usage, say battery capacity divided by twenty (C/20), might require more than twenty hours of portable operation without a recharging cycle.

DESCRIPTION OF FIGS. 9A AND 9B

Figure 9A:
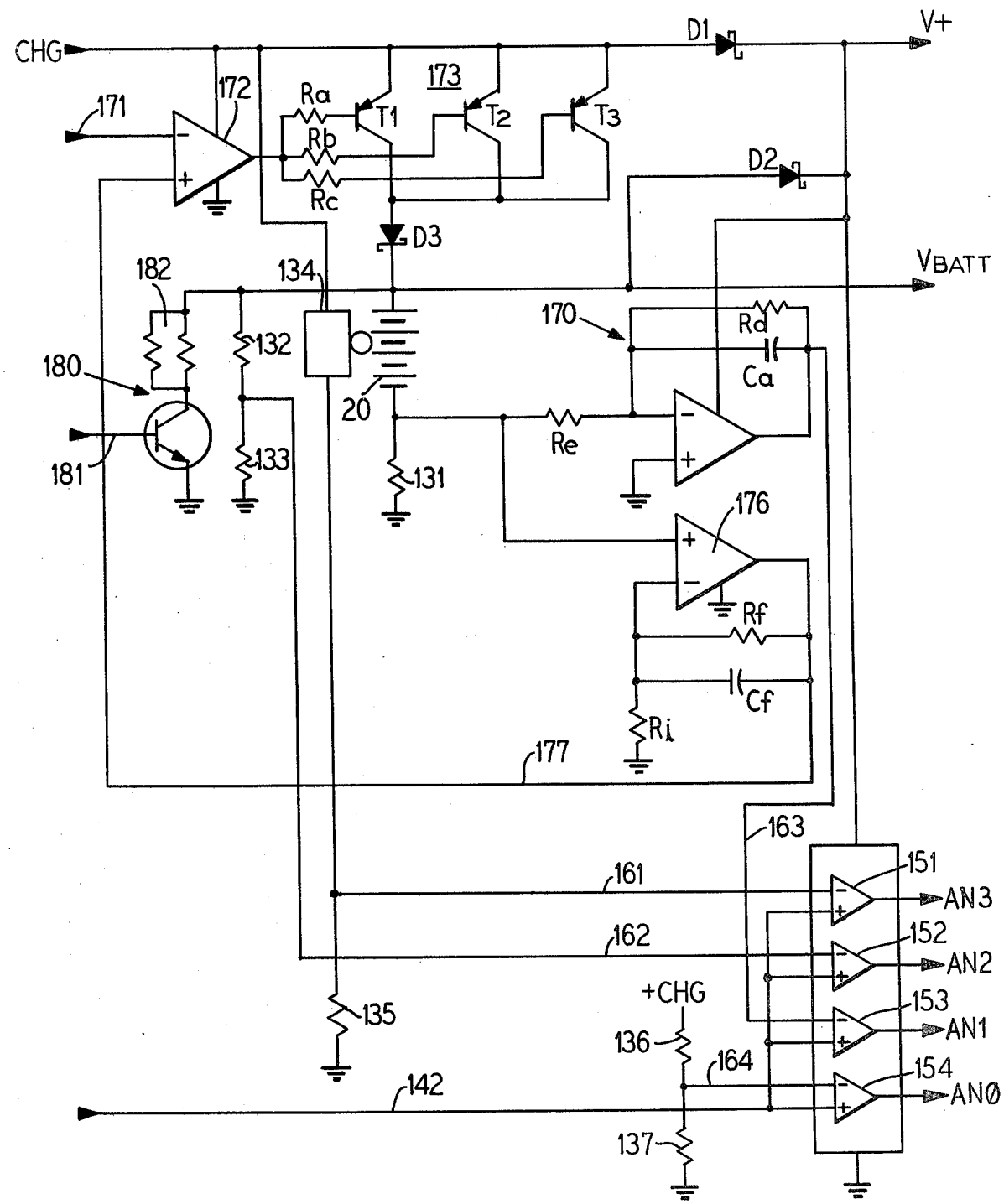
FIGS. 9A and 9B show a specific circuit implementation in accordance with the block diagram of FIG. 5, by way of example and not by way of limitation.
Figure 9B:
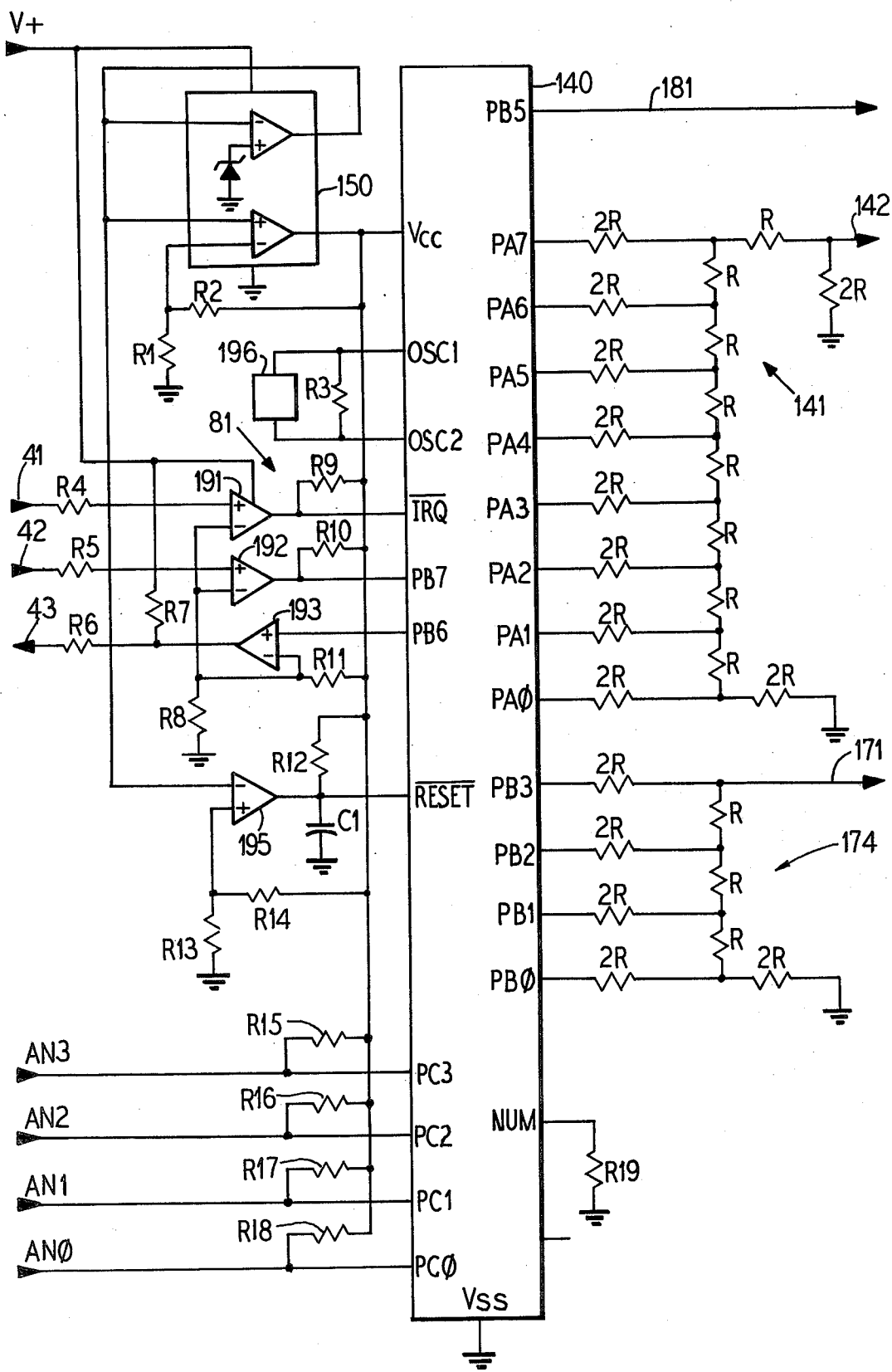

FIGS. 9A and 9B illustrate a more detailed circuit implementation in accordance with the block diagram of FIG. 5. In FIG. 9A the battery pack is schematically indicated at 20 and is shown as having a precision resistance element 131 permanently in series therewith for the purpose of sensing battery current during charging and discharging operations. By way of example, element 131 may have a resistance value of one-tenth ohm with a precision of one percent. The battery pack 20 also has associated therewith a precision voltage sensing arrangement comprising resistance elements 132 and 133. The resistance value of elements 132 and 133 in series is sufficiently high so that only a negligible battery current flows in this voltage sensing circuit. A battery temperature sensing transducer 134 is shown as being physically disposed in heat transfer relation to the battery pack 20. A precision resistance element 135 is shown in series with the transducer 134 for the purpose of supplying a voltage representative of battery temperature during a charging operation.

For the purpose of sensing charging voltage during a battery charging operation, precision resistance elements 136 and 137 are illustrated as being connected with the battery charging voltage input "+CHG". The resistance values of the voltage divider are selected such that the voltage across resistance element 137 will accurately represent the charging voltage during a battery charging operation. Analog to digital converter means is associated with the respective battery parameter sensing elements so as to convert the measurements into digital form. In the particular circuit embodiment illustrated in FIGS. 9A and 9B, this conversion operation is carried out with the use of programmed processor circuitry 140, FIG. 9B. The processor circuitry 140 controls an eight-bit R/2R ladder network 141 having an analog output at 142. The analog output line 142 is connected to comparators 151 through 154 shown in FIG. 9A and supplies a common analog reference voltage to the non-inverting inputs of these comparators. The inverting inputs 161 through 164 of the comparators 151 through 154 are coupled with the respective battery parameter sensing circuits. In a specific implementation, the processing circuitry 140 is implemented with a power supply voltage of three volts which may be obtained from a very accurate stable voltage reference supply/amplifier device 150. By utilizing a voltage reference as the power source for the processing circuitry 140, the output ports associated with the ladder network provide an accuracy comparable to that of a conventional digital to analog converter. In the particular embodiment illustrated there is a ninth bit in the most-significant bit location of the ladder network 141. This is provided so as to adapt the ladder network output at 142 to the input common mode voltage range of the comparators 151 through 154. Under worst case conditions, the battery terminal voltage may reach 4.0 volts which limits the common mode input voltage to 2.5 volts, approximately. To achieve eight-bit resolution, the full digital to analog voltage range must be accommodated by the comparators 151 through 154. By configuring the digital to analog converter network 141 as a nine-bit ladder with the most significant bit a logic zero, the lower eight bits of the nine-bit ladder remain, giving a resultant digital to analog voltage range of:

$$0V \cdot \leq D/A \text{ output} = \frac{255}{511} \text{Vref.} (=1.497V)$$

$$V_{step} = \frac{Vref.}{511} = 5.87 \text{mv/step, 256 steps}$$

so:
digital output 0 = 0 volts
digital output 255 = 1.497 volts

Figure 10:
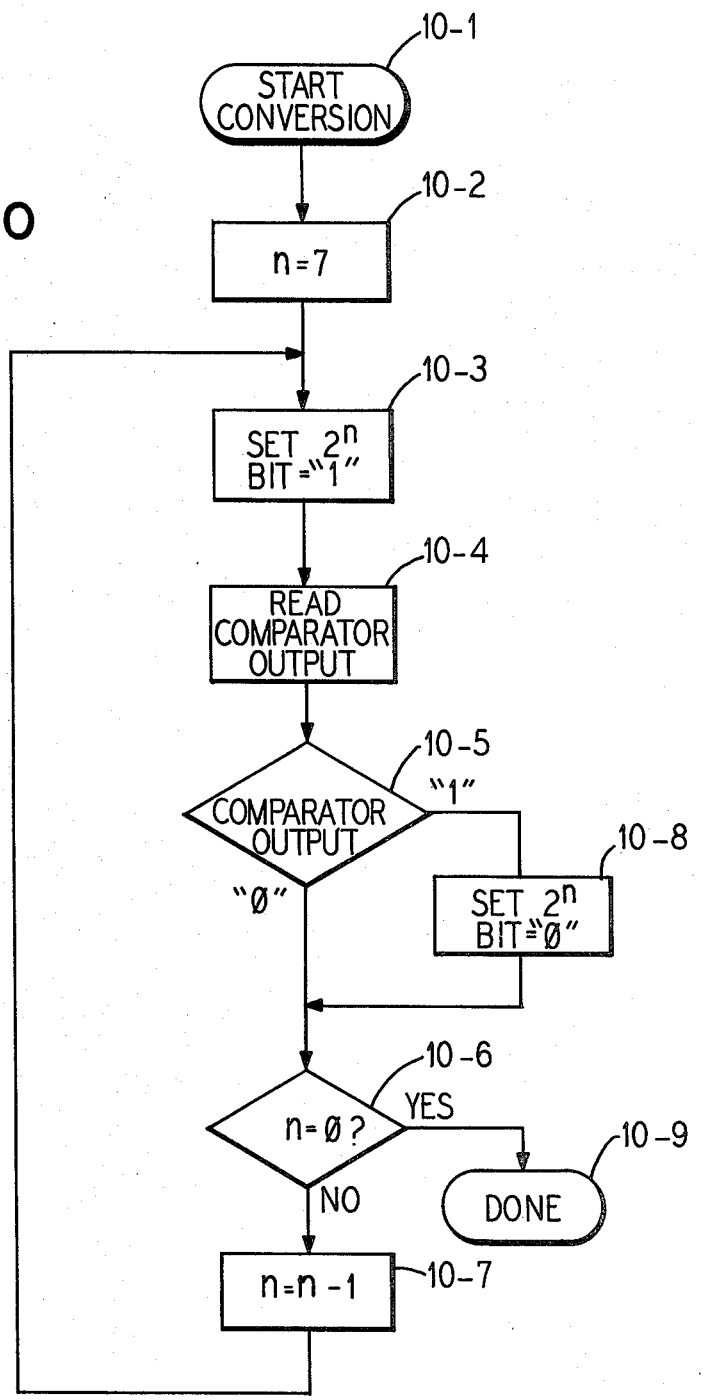
FIG. 10 is a flow diagram for illustrating an exemplary control program for carrying out analog to digital conversion of battery parameter values utilizing the particular exemplary circuit of FIGS. 9A and 9B.

With this digital to analog converter as a building block, a successive approximation analog to digital converter can be implemented with the voltage comparators 151 through 154 FIG. 9A and a straightforward microprocessor algorithm (as represented in FIG. 10).

The successive approximation algorithm depends on the assumption that the analog voltage being measured does not change appreciably during the conversion sequence. The nature of the exemplary application inherently has characteristics of slowly changing parameters with the exception of the discharge current, which can change abruptly and significantly. The solution to this potential difficulty is a low-pass filter amplifier which serves to integrate or average any rapidly changing current fluctuations.

Since the analog to digital converter has a conversion range of 0 to 1.497 volts, the four analog signals to be measured must be scaled appropriately to yield a convenient step resolution by offering measurability over the necessary range of values. The scaling values and step resolutions may be selected as follows:

1. Channel 0: Charge voltage step resolution=80 mv
maximum range: 20.40 volts
2. Channel 1: Discharge current
step resolution=2 ma
maximum range: 510 ma
3. Channel 2: Battery terminal voltage
step resolution=25 mv
maximum range: 6.375 volts
4. Channel 3: Battery temperature
step resolution=2°K.
maximum range: 509K=236° C.

Particularly in the case of channel two it might be noted that a four-cell nickel-cadmium battery pack can have a terminal voltage that exceeds 6.375 volts, which is the maximum range of channel two. In the present example, however, no additional useful information would be provided if the battery processor could determine when battery voltage exceeded 6.375 volts.

As previously mentioned, battery discharge current is subject to rapid fluctuations. Accordingly, the channel one current monitor means includes an integration circuit as indicated at 170 in FIG. 9A. The integration circuit 170 has its input connected with the current sensing resistance element 131 and its output connected with input line 163 of comparator 153, FIG. 9A.

Referring to FIG. 9A, an implementation of the battery charging controller 101 of FIG. 5 comprises an analog control line 171 leading to an inverting input of a comparator 172 which controls a battery charging current regulating circuit 173. The battery charging current is controlled by the processor circuitry 140, FIG. 9B, with the use of an additional four bit R/2R ladder network 174. The ladder network 174 supplies an analog command signal via line 171 for controlling components 172 and 173. Thus, the analog command signal can have one of sixteen discrete voltage levels. The output voltage range is from zero volts to 15/16 times the reference voltage level or 2.81 volts, with steps of 187.5 millivolts.

An operational amplifier 176, FIG. 9A, is coupled with the battery current sensing resistor 131 and provides an amplification such that a voltage step of 187.5 millivolts at input 171 of comparator 172, FIG. 9A, is matched by a battery current step of thirty-two milliamperes in resistance element 131. Thus, for a battery current in element 131 of thirty-two milliamperes, a voltage at output line 177 of 187.5 millivolts is supplied to the non-inverting input of comparator 172. The minimum charge current level is theoretically zero; however, finite input offset voltages present in the amplifier 176 predict a potential zero level charge current of six milliamperes maximum. This is insignificant when it is recognized that the only time the zero level charge value will be selected is during the deep cycle function when much larger current levels will be drained from the battery.

In the illustrated battery charging current regulating circuit 173, three power transistors in parallel have separate base resistors for balancing unequal device parameters and ensuring equal current and power dissipation sharing between the devices. A major design consideration in the illustrated embodiment is the power dissipation of the current regulator 173 coupled with the heat associated with the battery pack 20 during the charging cycle, especially during the overcharge portion of the charge cycle which occurs after the battery reaches approximately seventy-five percent of its maximum charge capacity. To retain compatibility with existing charging circuits, the regulated charger 172, 173 must be capable of operating with input charge voltage levels of at least twelve volts. In some instances, the applied charge voltage might exceed eighteen volts. The dissipation is the regulator devices of circuit 173 is given by the equation:

$$P_d = (V_{CHG} - V_{BATT}) I_{CHG}$$

Given worst case conditions:
$V_{CHG} = 18$ volts
$V_{BATT} = 4$ volts
$I_{CHG} = 480$ ma $$P_d = (18-4)(0.48) = 6.72 \text{ watts}$$

It is clear that 6.72 watts exceeds the power dissipation capacity of even three transistors in regulator network 173, and would generate excessive heat within an enclosed unit even if the transistors could handle the charge voltage input. Since the battery voltage is known and the charge current level is selected by the processor circuitry 140, the resultant power dissipation can be directly controlled by the processor circuit 140. This means that essentially constant power operation of the transistors of network 173 can be achieved when high charge voltage conditions exist. If the charge voltage input is reduced to a more efficient level, higher charge currents are possible when conditions permit. The minimum charge voltage input that would still give proper constant current regulation is approximately 7.0 volts, which would result in minimum power dissipation.

According to the teachings of the present invention, the battery pack 20 is to be subjected periodically to a deep discharge cycle, in order that the battery pack can maintain its full rated capacity and exhibit maximum operating life. A suggested discharge cycle to meet this requirement is discharging the battery at a C/10 rate to a terminal voltage of 4.0 volts for a four-cell configuration. A discharge control circuit for this purpose is indicated at 180 in FIG. 9A, the control input 181 being controlled from the processor circuitry 140 as indicated in FIG. 9B.

A deep discharge of battery pack 20 would not normally occur in the typical usage contemplated for the illustrated embodiment since normally the battery pack and associated portable system is used less than fourteen hours per day, while the design operating time for the battery pack is typically twenty hours. Furthermore, most logic devices and LSI circuits such as those utilized to implement component 71 of FIG. 5, will not function at 4.0 volts. The illustrated embodiment performs the deep discharge function by switching a resistive load 182, FIG. 9A, across the battery 20 that causes current to be drained out at a predetermined rate, typically C/10. During the deep discharge cycle, not only is the battery conditioned, but further, according to the teachings of the present invention, the available capacity of the battery is measured. By measuring the available capacity of the battery, a battery "life history" can be maintained that has important diagnostic potential. If the available capacity begins to decrease past predetermined values, the user can be alerted, for example, via the terminal display circuits component 72, FIG. 5, before a fault or field failure occurs. The battery current sensor element 131 and integrator circuit 170 may be utilized to measure battery capacity during the deep discharge cycle.

In order to allow the battery to be discharged down to a deep discharge level corresponding to an output voltage of 4.0 volts, an auxilliary power source should be available to power the logic in the portable terminal device of FIG. 5 during the deep discharge cycle. A power regulator circuit may be built into the portable terminal device that regulates 5.0 volts from either the battery 20 or the charge voltage input terminal "+CHG", whichever is higher in potential. The net result of this power control arrangement is to completely remove the terminal load from the battery whenever the system receives power from a charger. For the case of a portable terminal device having data in a volatile memory, it is necessary that the charge voltage input not be interrupted during a deep cycle sequence. A message at the display 12, FIG. 1, can inform the user that the deep cycle sequence is in progress and that the terminal device should not be used until the cycle is completed. To minimize the impact of this operation on the user, the deep cycle function including a full discharge followed by a normal charge cycle will be initiated by the application program in the terminal device so that a convenient non-interferring time can be selected for this relatively long duration function, for example, over a weekend.

The key to utilizing the functional capabilities of the battery processor 140 is to provide for digital communication between the battery processor and the terminal processor circuitry. A digital interface 81 has been indicated in FIG. 5 for this purpose and exemplary detailed circuitry in FIG. 9B has been given the same reference numeral. The interface 81 may process the following three data signals:

1. BPCLK:
   Battery Processor Clock (from terminal)
2. BPWDATA:
   Battery Processor Write Data (from terminal)
3. BPRDATA:
   Battery Processor Read Data (from battery processor)

These three signals are protected from damage by static discharge by means of one hundred kilohm resistors in line with each input or output. The battery processor interface utilizes voltage comparators 191, 192 and 193 which are relatively immune to static damage. At the terminal, CMOS devices are used, therefore 4.7 volts Zener diodes are provided to further protect these more sensitive components. The voltage comparators 191, 192 and 193 perform the additional function of level conversion between the battery processor operating at 3.0 volts and the terminal logic operating at 5.0 volts. The open collector outputs of the comparators are pulled up by resistors connected to the appropriate power supply to ensure proper logic levels in either direction.

The communication protocol is based on the terminal processor controlling data transfers by issuing a clocking signal to the battery processor. The battery processor has the capability of requesting service by causing an interrupt to the terminal processor when it pulls the BPRDATA signal from its rest 37 1" condition to a "0". This signal has a resistor pull down on the terminal side of the interface, so an interrupt will automatically occur whenever the battery pack is removed from the terminal.

It is recognized that complete discharge of the battery can occur. In this case, information stored in the battery processor circuitry 140 will be lost but the system must be able to restore itself and properly recover and recharge the battery. To ensure such recovery, a voltage comparator 195 monitors the 3.0 volt power supply 150 and forces a $\overline{\text{RESET}}$ condition if the voltage supplied to the processor goes out of range. When the battery pack is again placed on charge, the battery processor circuitry 140 will restart and the control program will re-establish execution and control of the battery system.

Where the battery pack assembly 18 could be accidentally inserted upside-down, and reverse the electrical connections, to prevent damage or operational faults, the interface signals are shown as being arranged so that no high powered signals are connected to other high powered signals if reversed. All reversed connections terminate through the 100 kilohm protection resistors at the strap conductors 41-44, limiting currents to safe levels.

By way of example, processor circuitry 140 may be implemented by means of a single chip microprocessor such as the MC146805F2 which is a high performance CMOS derivative of the MC6805, with a reduced pin-out arrangement that allows packaging in the JEDEC standard twenty-eight pin leadless chip carrier. Features of this device include:

1. Operation at $V_{CC} = 3.0V$
2. Low power standby "sleep" mode with self wake-up
3. External interrupt
4. Miniature package
5. CMOS port structure
6. On chip clock oscillator By way of example, a one megahertz crystal is indicated at 196 in association with the clock oscillator terminals of circuitry 140.

DESCRIPTION OF FIG. 10

FIG. 10 illustrates a successive approximation algorithm for carrying out analog to digital conversion with respect to one of the battery parameters sensed by the circuitry of FIG. 9A.

By way of specific example, if a battery charging operation is to take place and if the charge voltage at "+CHG" is 14.385 volts, then the voltage at input 164 of comparator 154 will have a value of 1.050 volts. Thus, at the start of a conversion operation for obtaining a digital measurement of charge voltage, as represented at 10-1 in FIG. 10, the analog voltage at the reference input line 142 will be at zero volts, and the output of comparator 154, designated AN0 (channel 0) will be at a logical zero level.

As represented at block 102 in FIG. 10, for the case of an eight-bit digital to analog converter network 141 as previously described, a variable n is initially assigned a value seven. According to step 103, a logical one value is thus assigned to the highest order output port of processor 140. The result is that the reference line 142 receives an analog output voltage corresponding to $2^7$ or 128 voltage increments (about 0.751 volts). Since the analog reference value at line 142, FIG. 9A, is still less than the analog voltage at line 164, comparator 154 continues to supply a logical zero signal to the processor 140.

According to the block 104 of FIG. 10, the comparator output logic level is read by the processor, and according to decision block 105 where the comparator output is at a logical zero, processing continues via block 106 to block 107, whereby the variable n is assigned the new value six.

Thereupon, upon return to step 103, a logical one signal is produced at the second highest order output port of processor circuit 140, so that a total of 192 voltage increments is supplied at analog reference line 142 (a voltage of about 1.127 volts). If the voltage level at line 164, FIG. 9A, is 1.050 volts, then the voltage level at line 142 now exceeds the voltage level at line 164, and the output of comparator 154 is at a logical one level. Accordingly at the decision step 10-5, the program branches to block 10-8, whereby the bit with the weight of $2^6$ is set to a logial zero value. Then according to step 10-6 and step 10-7, the variable n is set to five, and according to step 10-3 the bit with the weight of $2^5$ is set to a logical one value. Accordingly, analog reference line 142 receives a voltage of 160 voltage units (0.939 volts). Since the analog reference level at line 142 is now less than the analog value at line 164, comparator 154 supplies a logical zero signal, and processing continues through steps 10-4, 10-5 and 10-6. Next according to step 10-7, the variable n is set to a value of four, and so on. When finally the bit having a weight of $2^0$ has been set by the procedure of FIG. 10, the program branches to 10-9, and the analog input value at 164, FIG. 9A, has been converted into a corresponding digital value which may be stored in the memory of component 140 for further processing.

DESCRIPTION OF TABLES A AND B

On the following pages a Table A and a Table B pertaining to the battery processor component 82, FIG. 5, are set forth. In Table A, various suggested hexadecimal (HEX) codes are set forth which may be utilized in conjunction with the keyboard 11 (FIG. 1), for transmitting commands to the battery processor. In the case of hexadecimal codes 30 (HEX) through 35 (HEX), the requested battery information is transmitted by the battery processor via the digital interface 81, FIG. 5, for display on the terminal display screen 12, FIG. 1.

Table B illustrates the type of data which may be stored at respective memory locations of the memory circuits of component 82, FIG. 5. While the Tables are considered self-explanatory, a few comments on Table B are presented subsequent to the Tables:

TABLE A

BATTERY PROCESSOR: COMMAND FORMAT

| CODE (HEX) | FUNCTION |
| --- | --- |
| 00 | Error recovery RESET |
| 01 | Read STATUS (one byte returned) |
| 02 | RESET ALL, Begin history |
| 10 | Read analog channel 0 |
| 11 | Read analog channel 1 |
| 12 | Read analog channel 2 (one byte returned) |
| 13 | Read analog channel 3 |
| 20 | Set low reserve alert point (one byte sent) |
| 21 | Set low voltage alert point (one byte sent) |
| 22 | Set minimum capacity alert (one byte sent) |
| 30 | Read fuel gauge (one byte returned) |
| 31 | Read maximum available capacity (one byte returned) |
| 32 | Read charge cycle count (two bytes returned) |
| 33 | Read deep cycle count (two bytes returned) |
| 34 | Read accumulated hours used (two bytes returned) |
| 35 | Read use history indicator (four bytes returned) |
| 40 | Initiate deep cycle function |

TABLE B

BATTERY PROCESSOR: DATA DEFINITIONS

STATUS:

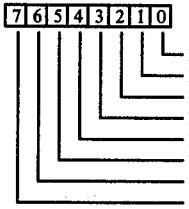

1 = COLD START, NO HISTORY
1 = CHARGE IN PROGRESS
1 = DEEP CYCLE IN PROGRESS
1 = LOW RESERVE CONDITION
1 = LOW VOLTAGE CONDITION
1 = IMPROPER CHARGE VOLTAGE
1 = CHARGE CYCLE INCOMPLETE
1 = MINIMUM CAPACITY ALERT

ANALOG VALUES:

8-BIT VALUES SCALED BY BATTERY PROCESSOR AS FOLLOWS:

CH. 0: CHARGE VOLTAGE, 80 mV/STEP, 20.4 VOLTS MAX
CH. 1: DISCHARGE CURRENT, 2 ma/STEP, 510 ma MAX
CH. 2: BATTERY TERMINAL VOLTAGE, 25 mV/STEP, 6.375 VOLTS MAX
CH. 3: BATTERY TERMPERATURE, 2° K./STEP (ABSOLUTE)

LOW RESERVE ALERT POINT:

8-BIT VALUE, 1 ≦ LOW RESERVE ALERT POINT ≦ 99
DEFAULT VALUE: 20 = 14(HEX) (20% RESERVE)
SCALED BY BATTERY PROCESSOR AS % C REMAINING WHEN
LOW RESERVE INTERRUPT GIVEN TO TERMINAL PROCESSOR

LOW VOLTAGE ALERT POINT:

TABLE B-continued

8-BIT VALUE, 0 ≦ LOW VOLTAGE ALERT POINT ≦ 255
DEFAULT VALUE 190 = 0BE(HEX) (4.75 VOLTS)
SCALED BY DATTERY PROCESSOR AS 25 mV/STEP
MINIMUM CAPACITY ALERT:

|7|6|5|4|3|2|1|0|

8-BIT VALUE, 0 ≦ MINIMUM ALERT ≦ 255
10 ma - HR/STEP, 2550 ma - HR MAX.
DEFAULT VALUE: 0 (ESSENTIALLY DISABLED)
WHEN MAXIMUM AVAILABLE CAPACITY (AS MEASURED BY
DEEP CYCLE FUNCTION) DECREASES TO THIS LEVEL,
AN INTERRUPT ALERT IS GIVEN TO THE
TERMINAL PROCESSOR.
MAXIMUM AVAILABLE CAPACITY (C):

|7|6|5|4|3|2|1|0|

8-BIT VALUE, 0 ≦ C ≦ 255
10 ma - HR/STEP, 2550 ma - HR MAX.
MEASURED AND SET DURING DEEP DISCHARGE FUNCTION
DEFAULT VALUE: 100 = 64 (HEX)
CHARGE CYCLE COUNT:

BYTE 1 (MS) |7|6|5|4|3|2|1|0|

BYTE 0 (LS) |7|6|5|4|3|2|1|0|

16-BIT VALUE, INITIALIZED TO 0
COUNTS NUMBER OF CHARGE CYCLES INITIATED
DEEP CYCLE COUNT:

BYTE 1 (MS) |7|6|5|4|3|2|1|0|

BYTE 0 (LS) |7|6|5|4|3|2|1|0|

16-BIT VALUE, INITIALIZED TO 0
COUNTS NUMBER OF DEEP DISCHARGE-RECHARGE CYCLES
ACCUMULATED HOURS:

BYTE 1 (MS) |7|6|5|4|3|2|1|0|

BYTE 0 (LS) |7|6|5|4|3|2|1|0|

16-BIT VALUE, INITIALIZED TO 0
COUNTS ACTUAL HOURS OF USE DELIVERING CURRENT
USE HISTORY INFORMATION: (4 BYTES)

BYTE 3 |7|6|5|4|3|2|1|0|

8-BIT VALUE, COUNTS MUMBER OF TIMES OVER
VOLTAGE ON CHARGE EXPERIENCED

BYTE 2 |7|6|5|4|3|2|1|0|

8-BIT VALUE, COUNTS NUMBER OF TIMES TEMP
EXCEEDED 45° C. DURING CHARGE

BYTE 1 |7|6|5|4|3|2|1|0|

8-BIT VALUE, AVERAGED DEPTH OF DISCHARGE
DURING USE, % C.

BYTE 0 |7|6|5|4|3|2|1|0|

8-BIT VALUE, CHANGE IN AVAILABLE CAPACITY
FROM MAXIMUM OBSERVED

TABLE B-continued

FUEL GAUGE:

| 7 | 6 | 5 | 4 | 3 | 2 | 1 | 0 |

8-BIT VALUE, 0 ≦ FUEL GAUGE VALUE ≦ 100
SCALED BY DATTERY PROCESSOR AS % C REMAINING

Referring to the STATUS word of Table B, for a new battery pack for example, for which no prior history has been recorded, bit zero of the STATUS word would be placed in a logical one condition representing a cold start of battery history. The remaining bits of the STATUS word could be at a logical zero level.

Various of the storage locations represented in Table B have default values which the locations receive in the absence of a particular selected value at the time of start up. For example, a LOW REsERvE ALERT POINT register would be set at a hexadecimal (HEX) value representing an alert point corresponding to a remaining capacity of the battery of 20% of its rated capacity. Thus, in the absence of a different setting, the battery processor would transmit an interrupt to the terminal processor (indicated at 71 in FIG. 5) when the battery had been discharged to such an extent that only a 20% reserve of capacity remained.

The CHARGE CYCLE COUNT of Table B, on the other hand, would be initialized to zero.

While the essential features of the invention will be fully understood from the foregoing description, it is proposed to include hereinafter certain further exemplary details concerning a specific implementation of an illustrative overall battery system. It should be understood, however, that the scope of the invention is defined by the claims hereof, and that specific details are given solely by way of example and not by way of limitation. An embodiment of the invention as defined in the claims is readily implemented by one of ordinary skill in the art without reference to the following elaboration.

Applicant would emphasize that the various features of the invention have substantial utility when practiced separately. For example, a non-reachargeable battery system with means for monitoring battery discharge current and automatically alerting the user when battery energy has been reduced to a selected value would have important utility independent of other features. A simplification of the disclosed portable system could be made by utilizing a non-portable system to insert a measured value of battery capacity into the memory of the battery system after each deep discharge cycle. For example the deep discharge and charging cycles might be controlled by a separate non-portable computer system at a central charging station. This computer system might be capable of communication with the memory of the battery system for inserting an accurate actual measurement of battery capacity. For the case of a central computer controlled charging station, the central computer could interrogate the memory of the battery system for relevant battery history and then selectively determine a suitable charging voltage and charging current. At selected times, the central computer could determine that the battery should be fully charged and then deep discharged to measure its actual capacity.

DESCRIPTION OF FIG. 11

Figure 11:
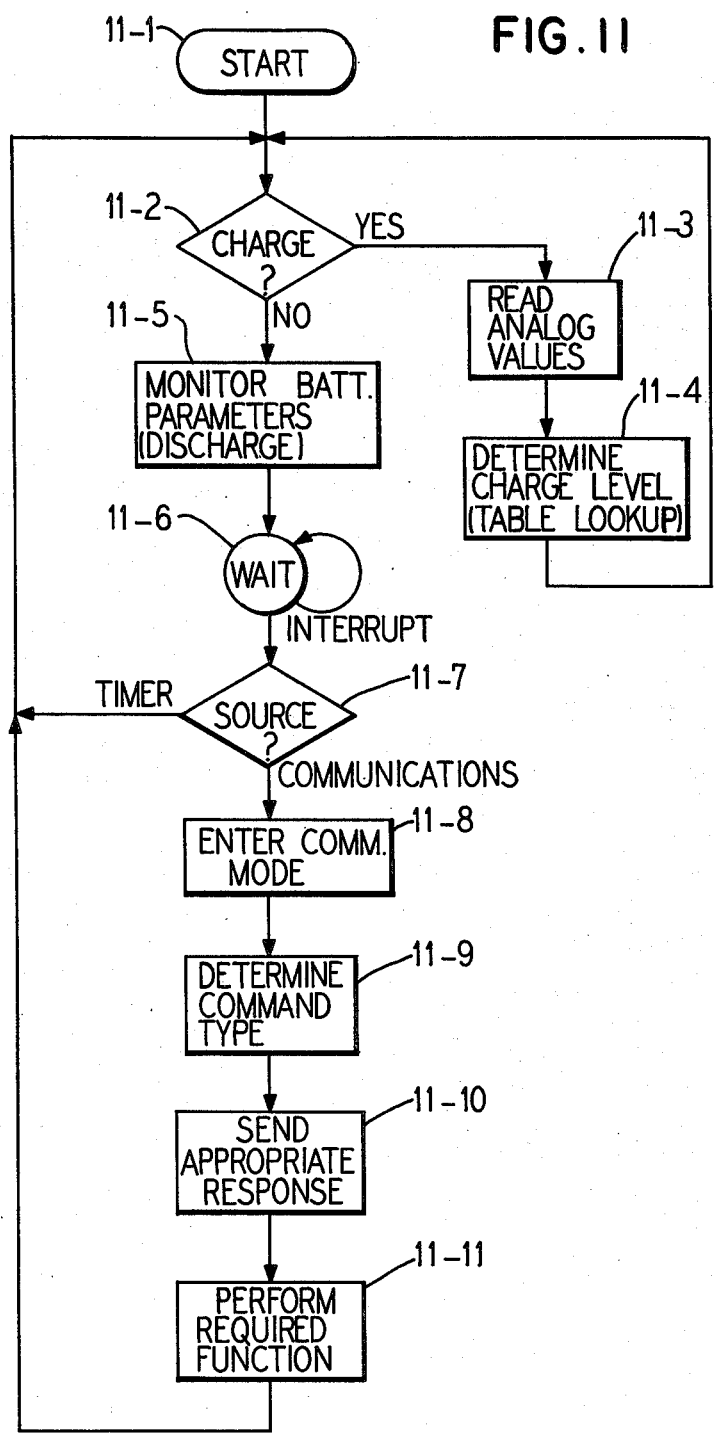
FIG. 11 is a flow diagram illustrating the general battery processor control program utilized in conjunction with the specific example of FIGS. 9A and 9B.

FIG. 11 is a flow chart showing the general control program for the battery processor. During start of the system as represented by block 11-1 various storage locations of the memory of component 82, FIG. 5, may be initialized.

With respect to decision block 11-2, the battery processor, for example, may interrogate the battery charging voltage monitor 103, FIG. 5, to determine if a charging voltage is present. If a charging voltage is present, control branches as indicated at 11-3 and 11-4 to obtain the optimum value of battery charging current. Otherwise as represented by blocks 11-5 and 11-6, the battery processor effects the monitoring of battery parameters so as to update the battery information of Table B at suitable intervals.

As represented by decision block 11-7, upon receipt of an interrupt, the battery processor determines if the source of the interrupt signal was the battery processor timer, in which case control returns to decision block 11-2. On the other hand if the source of the interrupt signal was a communication from the keyboard 11 of terminal device 10, processing continues as indicated at 11-8. The respective command types pursuant to blocks 11-9 through 11-11 correspond to the respective code groups of Table A. Following execution according to block 11-11, the control program returns to block 11-2.

DESCRIPTION OF TABLES C AND D

Exemplary circuit components and resistance and capacitance values for FIGS. 9A and 9B are shown in the following TABLES C and D.

TABLE C (FIG. 9A)

| | |
|---|---|
| Comparator 172 | LM10B |
| Transistors $T_1$, $T_2$, $T_3$ | ZTX750 |
| Resistors $R_a$, $R_b$, $R_c$ | 2.2 kilohms, each |
| Schottley Diodes $D_1$, $D_2$, $D_3$ | IN5819 |
| Circuit 180 | Darlington NPN |
| Resistors 182 | 47 ohms, ½ watt, each |
| Resistor 132 | 32.4 kilohms, 1% |
| Resistor 133 | 10 kilohms, 1% |
| Transducer 134 | AD 590 |
| Battery 20 | 2.2 ampere hour four cells × ½ D Polytemp Nickel-Cadmium |
| Resistor 131 | .1 ohm, 1% |
| Amplifier of 170 | CA 3260 |
| Resistor $R_d$ | 29.4 kilohms, 1% |
| Capacitor $C_a$ | .1 microfarad |
| Resistor $R_e$ | 1 kilohm, 1% |
| Amplifier 176 | CA 3260 |
| Resistor $R_f$ | 57.6 kilohm, 1% |
| Capacitor $C_f$ | .1 microfarad |
| Resistor $R_i$ | 1 kilohm, 1% |
| Resistor 135 | 2.94 kilohm, 1% |
| Resistor 136 | 127 kilohms, 1% |
| Resistor 137 | 10 kilohms, 1% |
| Comparators 151–154 | LM 339 |

TABLE D (FIG. 9B)

| | |
|---|---|
| Voltage Regulator 150 | LM10B |

TABLE D (FIG. 9B)-continued

| | |
|---|---|
| Resistor $R_1$ | 10 kilohms, 1% |
| Resistor $R_2$ | 140 kilohms, 1% |
| Crystal 196 | 1 megahertz |
| Resistor $R_3$ | 10 megohms |
| Resistors $R_4$, $R_5$, $R_6$, $R_8$ | 100 kilohms each |
| Resistor $R_7$ | 20 kilohms |
| Comparators 191-193 | LM 339 |
| Resistors $R_9$, $R_{10}$, $R_{11}$ | 100 kilohms each |
| Comparator 195 | LM 339 |
| Resistor $R_{12}$ | 100 kilohms |
| Capacitor $C_1$ | .1 microfarad |
| Resistor $R_{13}$ | 10 kilohms, 1% |
| Resistor $R_{14}$ | 127 kilohms, 1% |
| Resistors $R_{15-18}$ | 100 kilohms, each |
| R Resistance Values | 100 kilohms, 1%, each |
| 2R Resistance Values | 200 kilohms, 1%, each |
| Resistor $R_{19}$ | 10 kilohms |
| Processor Circuit 140 | MC 146805F2 |

It will be apparent that many modifications and variations may be made without departing from the scope of the teachings and concepts of the present invention.

What is claimed is:

1. In a portable battery powered system,
a portable battery powered utilization device for operating from battery power during portable operation thereof,
battery means operatively coupled with said utilization device for supplying operating power thereto, and
battery monitoring means operatively coupled with said battery means for monitoring battery parameters,
said utilization device together with said battery means and said battery monitoring means having a size and weight to be carried by an individual person, and
said battery monitoring means comprising battery parameter sensing means for sensing battery parameters and comprising memory means operatively coupled with said battery parameter sensing means and operative for storing data based on said battery parameters, representative of available battery capacity as measured during a deep discharge cycle, and
means comprising said memory means for indicating remaining battery capacity.

2. A portable battery powered system in accordance with claim 1, with
said utilization device comprising data processing means operatively coupled with said battery means for operation from battery power,
said battery monitoring means having data communication means operatively coupled with said data processing means of said utilization device, and providing for the transmission of data messages to said data processing means.

3. A portable battery powered system according to claim 1, with
said utilization device comprising data processing means operatively coupled with said battery means for operation from battery power,
said data processing means requiring a minimum battery voltage value from said battery means, and
said memory means being electrically connected with said battery means for receiving operating power therefrom during portable operation of said utilization device and being operable with a battery voltage substantially less than said minimum battery voltage value.

4. A portable battery powered system according to claim 1, with
said battery parameter sensing means comprising battery charge flow measurement means operatively coupled with said battery means for measuring the charge flow from the battery means during portable operation of said utilization device and for supplying battery charge flow data to said memory means, said memory means being operatively coupled with said battery charge flow measurement means for storing data representative of the quantities of charge supplied by said battery means during a portable operating cycle thereof.

5. A portable battery powered system according to claim 1, further comprising
charging control means operatively coupled with said battery means for controlling the rate of charging of said battery means.

6. In a portable battery powered system,
a portable battery powered utilization device for operating from battery power during portable operation thereof,
battery means operatively coupled with said utilization device for supplying operating power thereto, and
battery monitoring means operatively coupled with said battery means for monitoring battery parameters,
said utilization device together with said battery means and said battery monitoring means having a size and weight to be carried by an individual person, and
said battery monitoring means comprising battery parameter sensing means for sensing battery parameters and comprising memory means operatively coupled with said battery parameter sending means and operative for storing data based on said battery parameters,
said utilization device having battery receiving means for removably receiving said battery means and said battery monitoring means.

7. A portable battery powered system according to claim 6, with
said battery monitoring means being secured to said battery means for removal and replacement as a unit with respect to said battery receiving means.

8. In a portable battery powered system,
a portable battery powered utilization device for operating from battery power during portable operation thereof,
battery means operatively coupled with said utilization device for supplying operating power thereto, and
battery monitoring means operatively coupled with said battery means for monitoring battery parameters,
said utilization device together with said battery means and said battery monitoring means having a size and weight to be carried by an individual person, and
said battery monitoring means comprising battery parameter sensing means for sensing battery parameters and comprising memory means operatively coupled with said battery parameter sensing means and operative for storing data based on said battery parameters, said utilization device comprising data processing means operatively coupled with said battery means for operation from battery power, said battery monitoring means having data communication means operatively coupled with said data processing means of said utilization device, and providing for the transmission of data messages to said data processing means, said battery monitoring means being secured with said battery means for removal and replacement as a unit with respect to said utilization device.

9. In a portable battery powered system, a portable battery powered utilization device for operating from battery power during portable operation thereof, battery means operatively coupled with said utilization device for supplying operating power thereto, and battery monitoring means operatively coupled with said battery means for monitoring battery parameters, said utilization device together with said battery means and said battery monitoring means having a size and weight to be carried by an individual person, and said battery monitoring means comprising battery parameter sensing means for sensing battery parameters and comprising memory means operatively coupled with said battery parameter sensing means and operative for storing data based on said battery parameters, said memory means being electrically powered by said battery means during removal of the battery means and said battery monitoring means including said memory means as a unit from said utilization device and during transport thereof separate from the utilization device.

10. In a portable battery powered system, a portable battery powered utilization device for operating from battery power during portable operation thereof, battery means operatively coupled with said utilization device for supplying operating power thereto, and battery monitoring means operatively coupled with said battery means for monitoring battery parameters, said utilization device together with said battery means and said battery monitoring means having a size and weight to be carried by an individual person, and said battery monitoring means comprising battery parameter sensing means for sensing battery parameters and comprising memory means operatively coupled with said battery parameter sensing means and operative for storing data based on said battery parameters, charging control means operatively coupled with said battery means for controlling the rate of charging of said battery means, said charging control means comprising digital to analog converter means for generating respective analog charge level command signals representing respective charging rates suited to the recharging of the battery means under respective varying conditions.

11. A portable battery powered system according to claim 10, with said charging control means comprising a battery charging voltage input forming part of a battery charging current path for said battery means, charging current regulating means operatively coupled with said battery charging voltage input and operative to control the magnitude of the charging current supplied to said battery means via said battery charging current path, said charging current regulating means having a control input for receiving a charging level control signal and being operative to control the charging current supplied to said battery means in accordance with said charging level control signal, and battery charging current sensing means operatively coupled with said battery charging current path for sensing the magnitude of battery charging current, said charging control means further comprising comparator means having input means operatively coupled with said battery charging current sensing means and with said digital to analog converter means and having a comparator output operatively coupled with said control input of said charging current regulating means for controlling the magnitude of the battery charging current in accordance with the analog charge level command signal from said digital to analog converter means.

12. A portable battery powered system according to claim 11, with said battery parameter sensing means further comprising battery charging voltage sensing means operatively coupled with said battery charging voltage during a battery charging cycle, and analog to digital converter means operatively coupled with said charging voltage sensing means and operative to periodically read the value of said charging voltage during a battery charging cycle.

13. A portable battery powered system according to claim 11, with said battery parameter sensing means further comprising battery temperature sensing means operatively coupled with said battery means for sensing the temperafture of the battery means during a battery charging cycle, and analog to digital converter means operatively coupled with said temperature sensing means and operative to periodically read the value of battery temperature during a battery charging cycle.

14. In a portable battery powered system, a portable battery powered utilization device for operating from battery power during portable operation thereof, battery means operatively coupled with said utilization device for supplying operating power thereto, and battery monitoring means operatively coupled with said battery means for monitoring battery parameters, said utilization device together with said battery means and said battery monitoring means having a size and weight to be carried by an individual person, and said battery monitoring means comprising battery parameter sensing means for sensing battery parameters and comprising memory means operatively coupled with said battery parameter sensing means and operative for storing data based on said battery parameters, a battery charging voltage input forming part of a battery charging current path for said battery means, battery charging voltage sensing means operatively coupled with said battery charging voltage input for sensing charging voltage during a battery charging cycle, battery temperature sensing means operatively coupled with said battery means for sensing the temperature of the battery means during a battery charging cycle, analog to digital converter means having first and second comparator means with a common reference input and respective first and second analog inputs, and first and second coupling means coupling said battery charging voltage sensing means and said battery temperature sensing means to the respective first and second analog inputs of the respective first and second comparator means and adapting the analog input levels at said first and second analog inputs to a common digitally generated reference level at said common reference input.

15. A portable battery powered system according to claim 14, with said analog to digital converter means further comprising digitally controlled reference means for generating respective discrete digitally generated reference levels and operatively coupled with said first and second comparator means for supplying a digitally generated reference level for matching the analog input levels at the respective first and second comparator means periodically in a desired sequence.

16. A portable battery powered system according to claim 15, further comprising battery voltage sensing means operatively coupled with said battery means for sensing battery output voltage, third comparator means operatively coupled with said common reference input for receiving the digitally generated reference signal from said digitally controlled reference means in common with said first and second comparator means and having a third analog input, and third coupling means coupling said battery voltage sensing means with said third analog input and adapting the analog input level at said third analog input to the common digitally generated reference level at said common reference input.

17. In a portable battery powered system, a portable battery powered utilization device for operating from battery power during portable operation thereof, battery means operatively coupled with said utilization device for supplying operating power thereto, and battery monitoring means operatively coupled with said battery means for monitoring battery parameters, said utilization device together with said battery means and said battery monitoring means having a size and weight to be carried by an individual person, and said battery monitoring means comprising battery parameter sensing means for sensing battery parameters and comprising memory means operatively coupled with said battery parameter sensing means and operative for storing data based on said battery parameters, battery discharge mode control means operatively coupled with said battery means for controlling discharge of the battery means prior to recharge thereof, for the purpose of conditioning of the battery means and prolonging its useful life.

18. A portable battery powered system according to claim 17, with said battery discharge mode control means comprising discharge current control means operatively coupled with said battery means and providing a battery current discharge path capable of discharging the battery means down to a deep discharge level during a deep discharge cycle having a time duration of not more than ten hours.

19. A portable battery powered system according to claim 18, with said battery discharge mode control means further comprising battery voltage sensing means operatively coupled with said battery means and operative to sense the output voltage of said battery means during a deep discharge cycle, analog to digital converter means operatively coupled with said battery voltage sensing means and operative to periodically read the value of the output voltage of said battery means during a deep discharge cycle, and digital logic means operatively coupled with said discharge current control means and operative to supply a digital logic signal to said discharge current control means when the output voltage of said battery means corresponds to a deep discharge condition of the battery means.

20. In a portable battery powered system, a portable battery powered utilization device for operating from battery power during portable operation thereof, battery means operatively coupled with said utilization device for supplying operating power thereto, and battery monitoring means operatively coupled with said battery means for monitoring battery parameters, said utilization device together with said battery means and said battery monitoring means having a size and weight to be carried by an individual person, and said battery monitoring means comprising battery parameter sensing means for sensing battery parameters and comprising memory means operatively coupled with said battery parameter sensing means and operative for storing data based on said battery parameters, said battery monitoring means further comprising programmed processor circuitry having a processor supply voltage input, and voltage regulator means operatively coupled with said battery means for receiving battery voltage therefrom and operatively coupled with said processor supply voltage input for supplying a selected operating voltage to said programmed processor circuitry.

21. A portable battery powered system according to claim 20, further comprising a battery charging voltage input electrically coupled with said battery means for supplying battery charging current to said battery means via a battery charging current path, and coupling means for coupling said battery charging voltage input with said programmed processor circuitry for supplying operating current to said processor circuitry during a charging cycle.

22. A portable battery powered system according to claim 20, with said programmed processor circuitry having a minimum operating voltage less than a deep discharge voltage of the battery means and less than a minimum battery operating voltage of said portable battery powered utilization device.

23. A portable battery powered system according to claim 22, further comprising deep discharge circuit means for operative electrical connection with said battery means for effecting a deep discharge cycle of said battery means prior to recharging thereof, and discharge control means operatively coupled with said battery means and with said deep discharge circuit means and operative to terminate a deep discharge cycle before the battery voltage falls below said minimum operating voltage of said programmed processor circuitry.

24. In a portable battery powered system, a portable battery powered utilization device for operating from battery power during portable operation thereof, battery means operatively coupled with said utilization device for supplying operating power thereto, and battery monitoring means operatively coupled with said battery means for monitoring battery parameters, said utilization device together with said battery means and said battery monitoring means having a size and weight to be carried by an individual person, and said battery monitoring means comprising battery parameter sensing means for sensing battery parameters and comprising memory means operatively coupled with said battery parameter sensing means and operative for storing data based on said battery parameters, said battery parameter sensing means comprising battery charge flow measurement means operatively coupled with said battery means for sensing charge flow from the battery means during portable operation of said utilization device, and programmed processor circuitry operatively coupled with said battery charge flow measurement means and having program means for generating a digital number matching the analog value of the charge flow as sent by said battery charge flow measurement means at respective sampling intervals and operatively coupled with said memory means for storing data representative of the quantity of charge supplied by said battery means during a portable operating cycle thereof.

25. In a portable battery powered system, a portable battery powered utilization device for operating from battery power during portable operation thereof, battery means operatively coupled with said utilization device for supplying operating power thereto, and battery monitoring means operatively coupled with said battery means for monitoring battery parameters, said utilization device together with said battery means and said battery monitoring means having a size and weight to be carried by an individual person, and said battery monitoring means comprising battery parameter sensing means for sensing battery parameters and comprising memory means operatively coupled with said battery parameter sensing means and operative for storing data based on said battery parameters, said battery parameter sensing means comprising battery charge flow measurement means operatively coupled with said battery means for sensing charge flow from the battery means during portable operation of said utilization device, and analog to digital converter means operatively coupled with said battery charge flow measurement means for supplying readings of battery charge flow, said memory means being operatively coupled with said analog to digital converter means for storing data representative of the quantity of charge supplied by said battery means during a portable operating cycle thereof.

26. A portable battery powered system according to claim 25, with said battery parameter sensing means further comprising battery voltage sensing means operatively coupled with said battery means for measuring the output voltage of said battery means, said analog to digital converter means being operatively coupled with said battery voltage sensing means for supplying readings of battery output voltage, and said memory means being operatively coupled with said analog to digital converter means and being operative to store data based on the battery output voltage readings.

27. A portable battery powered system according to claim 25, with said battery parameter sensing means further comprising battery temperature sensing means operatively coupled with said battery means for sensing battery temperature during portable operation of said utilization device, said analog to digital converter means being operatively coupled with said battery temperature sensing means for supplying readings of battery temperature, and said memory means being operatively coupled with said analog to digital converter means to store data based on the battery temperature readings.

28. In a portable battery powered system, a portable battery powered utilization device for operating from battery power during portable operation, thereof, battery means operatively coupled with said utilization device for supplying operating power thereto, and battery monitoring means operatively coupled with said battery means for monitoring battery parameters, said utilization device together with said battery means and said battery monitoring means having a size and weight to be carried by an individual person, and said battery monitoring means comprising battery parameter sensing means for sensing battery parameter and comprising memory means operatively coupled with said battery parameter sensing means and operative for storing data based on said battery parameters.

battery charge flow measurement means operatively coupled with said battery means for sensing charge flow from the battery means during portable operation of said utilization device, said battery charge flow measurement means supplying an analog battery charge flow measurement signal which varies as a function of time in accordance with battery discharge current, said battery monitoring means comprising integration means operatively coupled with said battery charge flow measurement means for integrating the analog battery charge flow measurement signal with respect to time to provide an integrated analog battery charge flow measurement and having a measurement time interval within which the integrated analog battery charge flow measurement will substantially accurately reflect total battery discharge current, and analog to digital converter means operatively coupled with said integration means and being timed with respect to the measurement time interval of the integration means for sampling the integrated battery charge flow measurement within said measurement time interval.

29. In a battery monitoring system for a portable battery powered device, battery means for operative coupling with a portable battery powered device for the purpose of supplying battery current thereto during portable operation, said battery means comprising a rechargeable battery pack of a size and weight such as to be operatively coupled to and carried with a portable battery powered device by an individual person, battery condition monitoring circuitry comprising memory means for storing a battery condition measurement value based on discharge operation of the battery pack to a deep discharge level, and battery current monitoring means operatively coupled with said battery pack during portable operation thereof as part of a portable battery powered device and operable for monitoring battery current supplied by said battery pack and operatively coupled with said memory means for supplying battery condition information based on the battery condition measurement value and the battery current supplied by the battery pack after the last charging thereof, said battery condition monitoring circuitry being operative to provide a user of the portable battery powered device with an indication of the remaining operating time of the device before recharging of the battery pack is required.

30. A battery monitoring system according to claim 29, with said battery current monitoring means comprising battery current sensing means operatively coupled with said battery pack for sensing the magnitude of the instantaneous battery current supplied by said battery pack during said portable operation, integration means operatively coupled with said battery current sensing means for forming an integral with respect of time of the battery current and for providing an indication of the total amount of charge supplied by the battery pack after the last charging thereof as part of said battery condition information, and output means operatively coupled with said memory means for displaying a battery condition indication based on said battery condition information and indicative of the remaining operating time of the device.

31. A battery monitoring system according to claim 29, with said battery condition monitoring circuitry being secured to said battery pack for manipulation as a unit therewith in the removal and replacement of the battery pack from a portable battery powered device.

32. A battery monitoring system according to claim 29, with said battery condition monitoring circuitry comprising a microprocessor operatively coupled with said battery current monitoring means and operable for controlling said memory means to effect the storage therein of said battery condition information.

33. In a battery condition system for a portable battery powered device, battery means for operative coupling with a portable battery powered device for the purpose of supplying battery current thereto during portable operation, said battery means comprising a rechargeable battery pack of a size and weight such as to be operatively coupled to and carried with a portable battery powered device by an individual person, and battery conditioning circuitry operatively coupled with said battery pack and carried therewith for manipulation as a unit in the removal and replacement of the battery pack from a portable battery powered device.

34. A battery conditioning system in accordance with claim 33, with said battery conditioning circuitry being operative for effecting a deep discharge cycle of said battery means.

35. A battery conditioning system in accordance with claim 33, with said battery conditioning circuitry being operative to sense battery parameters during a battery charging operation.

36. A battery conditioning system in accordance with claim 33, with said battery conditioning circuitry comprising digital processor means carried as a unit with said battery means and memory means controlled by said porcessor means for maintaining a measure of remaining battery capacity during portable operation of said battery means with a portable battery powered device.

37. In a battery conditioning system for a portable battery powered device requiring a minimum operating voltage for reliable operation, battery means for operative coupling with a portable battery powered device for the purpose of supplying operating energy thereto, said battery means comprising a rechargeable electrochemical energy storage medium having an output voltage which is a function not only of the energy stored thereby but also of the number of shallow energy discharge cycles which have occurred after its last deep discharge cycle, said battery means being of a size and weight to be carried by an individual person along with a portable battery powered device requiring a minimum operating voltage for reliable portable operation, and battery conditioning circuitry operatively coupled with said battery means and operable for effecting a deep discharge cycle wherein the battery output voltage is reduced to a value below said minimum operating voltage.

38. A battery conditioning system in accordance with claim 37, with said battery conditioning circuitry comprising digital processor means operatively coupled with said battery means for monitoring battery parameters and for sensing when the battery output voltage is reduced to a value below said minimum operating voltage so as to terminate the deep discharge cycle.

39. A battery conditioning system in accordance with claim 38, with said digital processor means being reliably operable with a range of supply voltages including supply voltage values above and below said minimum operating voltage of a portable battery powered device to be operated by said battery means.

40. A battery conditioning system in accordance with claim 37, with said battery conditioning circuitry being secured with said battery means for removal and replacement as a unit from a portable battery powered device.

41. A battery conditioning system according to claim 37, with said battery conditioning circuitry comprising battery discharge circuit means operatively coupled with said battery means and controllable to effect a deep discharge cycle of said battery means such that the output voltage of the battery means falls below said minimum operating voltage of a portable battery powered device.

42. A battery conditioning system according to claim 41, with said battery conditioning circuitry comprising discharge energy measurement means operatively coupled with said battery means for measuring the amount of energy supplied by said battery means during a deep discharge cycle as a measure of the condition of the battery means.

43. A battery conditioning system in accordance with claim 42, with said battery conditioning circuitry further comprising memory means operatively coupled with said discharge energy measurement means to store a battery capacity indication based on the amount of energy supplied by said battery means during a deep discharge cycle.

* * * * *